(12) United States Patent
Kosaka et al.

(10) Patent No.: US 7,754,616 B2
(45) Date of Patent: Jul. 13, 2010

(54) SEMICONDUCTOR DEVICE AND METHOD OF MANUFACTURING THE SAME

(75) Inventors: Toshiyuki Kosaka, Yamanashi (JP); Masaomi Emori, Yamanashi (JP)

(73) Assignee: Eudyna Devices Inc., Yamanashi (JP)

(*) Notice: Subject to any disclaimer, the term of this patent is extended or adjusted under 35 U.S.C. 154(b) by 108 days.

(21) Appl. No.: 11/712,422

(22) Filed: Mar. 1, 2007

(65) Prior Publication Data
US 2007/0207614 A1 Sep. 6, 2007

(30) Foreign Application Priority Data
Mar. 1, 2006 (JP) .............................. 2006-055567

(51) Int. Cl.
*H01L 21/302* (2006.01)
(52) U.S. Cl. .................. 438/720; 438/706; 438/742; 216/75
(58) Field of Classification Search .............. 438/706, 438/710, 712, 720, 723, 717, 736, 742; 216/67, 216/75
See application file for complete search history.

(56) References Cited

U.S. PATENT DOCUMENTS

| | | | | |
|---|---|---|---|---|
| 4,742,325 A | * | 5/1988 | Muller et al. ............... | 338/309 |
| 7,387,370 B2 | * | 6/2008 | Shaarawi et al. ............... | 347/63 |
| 2005/0161160 A1 | * | 7/2005 | Tanabe et al. .......... | 156/345.48 |
| 2005/0243141 A1 | * | 11/2005 | Shaarawi et al. ............... | 347/63 |
| 2005/0250336 A1 | | 11/2005 | Komatani | |

FOREIGN PATENT DOCUMENTS

| | | |
|---|---|---|
| JP | 08-274448 | 10/1996 |
| JP | 2003-224300 | 8/2003 |
| JP | 2005-322811 | 11/2005 |

OTHER PUBLICATIONS

Japanese Office Action dated Jan. 12, 2010, with English Translation.

* cited by examiner

*Primary Examiner*—Lan Vinh
(74) *Attorney, Agent, or Firm*—Kratz, Quintos & Hanson, LLP

(57) ABSTRACT

A method of manufacturing a semiconductor device includes: forming a mask layer on a layer that is to be subjected to etching and contains at least one of silicon carbonate, silicon oxide, sapphire, gallium nitride, aluminum gallium nitride, indium gallium nitride, and aluminum nitride, the mask layer having an opening and including a nickel chrome film, a gold film, and a nickel film in this order when seen from the layer to be subjected to etching; and performing etching on the layer to be subjected to etching, with the mask layer serving as a mask.

6 Claims, 5 Drawing Sheets

SEMICONDUCTOR DEVICE AND METHOD OF MANUFACTURING THE SAME

BACKGROUND OF THE INVENTION

1. Field of the Invention

The present invention generally relates to a semiconductor device and a method of manufacturing the semiconductor device, and more particularly, to a semiconductor device that has a semiconductor layer subjected to etching, with a Ni film serving as a mask, and a method of manufacturing the semiconductor device.

2. Description of the Related Art

When dry etching is performed selectively on a substrate or a semiconductor layer, the etching is performed on the substrate or the layer to be subjected to etching, with a mask layer serving as a mask. The mask layer is formed selectively on the substrate or the layer to be subjected to etching. If the reaction constant of the substrate or the layer to be subjected to etching is small, the speed at which the etching is performed on the substrate or the layer to be subjected to etching is low. Particularly, in a case where etching is performed on a thick substrate or a thick layer, the etching selectivity that represents the etching speed ratio of the mask layer to the substrate or the layer to be subjected to etching is required to be high, so that the mask layer cannot be lost during the etching. For example, Japanese Patent Application Publication No. 2003-224300 discloses a technique of performing etching on a GaN (gallium nitride) film, with a mask being a mask layer consisting of a silicon oxide film and an aluminum oxide film.

The mask layer used for etching needs to have high etching selectivity with respect to the material to be subjected to etching. Further, detachment of the mask layer due to a temperature change during the etching must be prevented.

SUMMARY OF THE INVENTION

It is therefore an object of the present invention to provide a semiconductor device and a method of manufacturing the semiconductor device in which the above disadvantages are eliminated.

A more specific object of the present invention is to provide a semiconductor device that has high etching selectivity and can prevent detachment of the mask layer, and a method of manufacturing such a semiconductor device.

According to one aspect of the present invention, there is provided a method of manufacturing a semiconductor device including: forming a mask layer on a layer that is to be subjected to etching and contains at least one of silicon carbonate, silicon oxide, sapphire, gallium nitride, aluminum gallium nitride, indium gallium nitride, and aluminum nitride, the mask layer having an opening and including a nickel chrome film, a gold film, and a nickel film stacked in this order from the layer to be subjected to etching; and performing etching on the layer to be subjected to etching, with the mask layer. In accordance with an aspect of the present invention, the etching selectivity is increased by virtue of the nickel film, and detachment of the mask layer is prevented by virtue of the nickel chrome film. Further, the adhesion between the nickel chrome film and the nickel film is increased by virtue of the gold film.

According to another aspect of the present invention, there is provided a semiconductor device including: a substrate or layer that contains at least one of silicon carbonate, silicon oxide, sapphire, gallium nitride, aluminum gallium nitride, indium gallium nitride, and aluminum nitride; and a first metal layer that is formed on the substrate or layer, has an opening, and includes a nickel chrome film and a gold film stacked in this order when seen from the substrate or layer, the substrate or layer having a concave or via hole portion below the opening. In accordance with an aspect of the present invention, it is possible to provide a semiconductor device that can prevent detachment of the mask layer used for the etching performed for forming the concave or via hole portion.

According to yet another aspect of the present invention, there is provided a semiconductor device including: a substrate or layer that contains at least one of silicon carbonate, silicon oxide, sapphire, gallium nitride, aluminum gallium nitride, indium gallium nitride, and aluminum nitride; and a first metal layer that is formed on the substrate or layer, has an opening, and includes a nickel chrome film and a gold film stacked in this order when seen from the substrate or layer, the substrate or layer having a concave or via hole portion below the opening, a second metal layer being formed on the first metal layer and in the concave or via hole portion. In accordance with the present invention, it is possible to provide a semiconductor device that can prevent detachment of the mask layer used for the etching performed for forming the concave or hole portion.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention.

First Embodiment

Figure 1A:
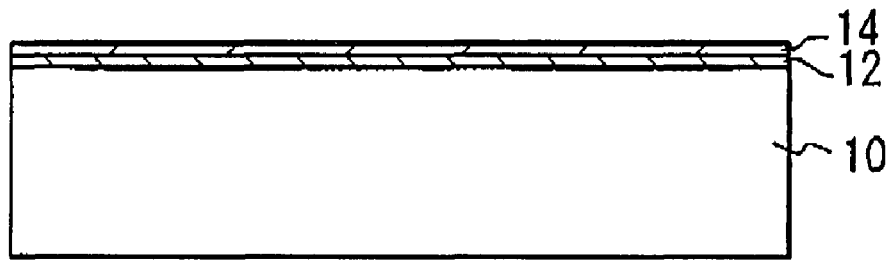
FIGS. 1A through 1C are cross-sectional views showing the first half of a method of manufacturing a semiconductor device in accordance with a first embodiment of the present invention.
Figure 1B:
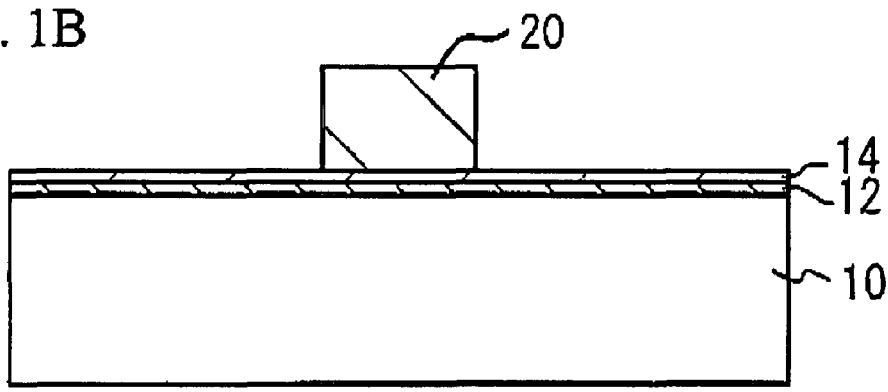
Figure 1C:
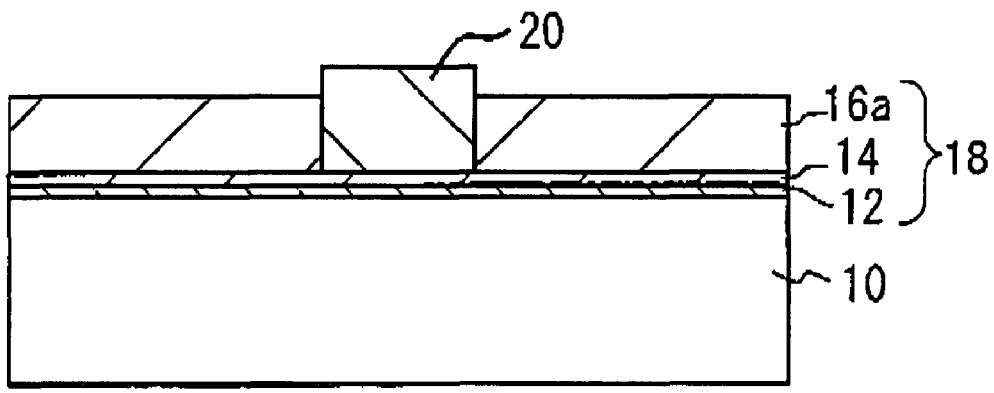

A first embodiment of the present invention is an example structure having a Ni (nickel) film formed by a plating technique. FIGS. 1A through 2C are cross-sectional views showing a method of manufacturing a semiconductor device in accordance with the first embodiment. As shown in FIG. 1A, a NiCr (nickel chrome) film 12 of 70 nm in film thickness and an Au (gold) film 14 of 100 nm in film thickness are formed on a substrate 10 (a layer to be subjected to etching) made of SiC (silicon carbonate) by a vapor deposition technique. The film thicknesses of the NiCr film 12 and the Au film 14 can be arbitrarily set so as to obtain adhesion. As shown in FIG. 1B, the photoresist pattern 20 is formed on the Au film 14, so as to form an opening in the region of the substrate 10 to be subjected to etching. As shown in FIG. 1C, a Ni film 16a of 10 µm in film thickness is formed on the Au film 14 by a plating technique. The film thickness of the Ni film 16a can be arbitrarily set so that the Ni film 16a can serve as an etching mask.

Figure 2A:
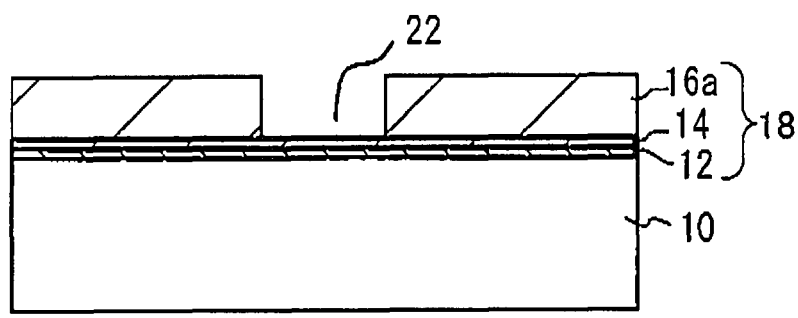
FIGS. 2A through 2C are cross-sectional views showing the second half of the method of manufacturing the semiconductor device in accordance with the first embodiment.
Figure 2B:
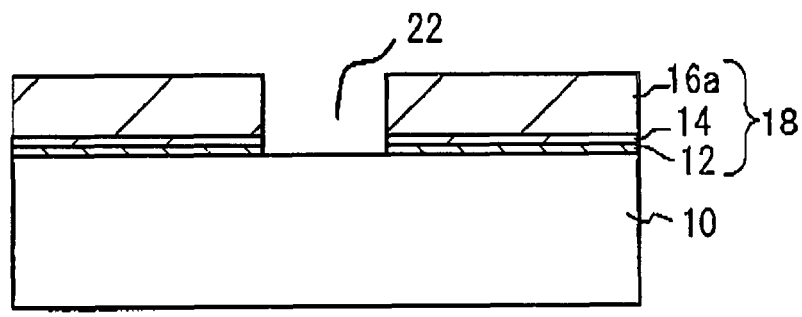
Figure 2C:
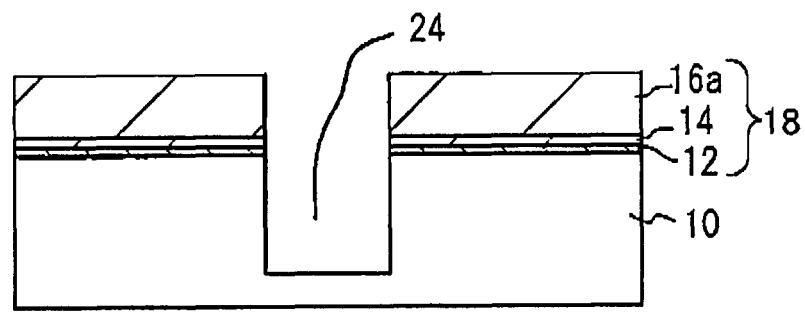

As shown in FIG. 2A, the photoresist 20 is removed. As a result, an opening 22 is formed in the Ni film 16a. As shown in FIG. 2B, with the Ni film 16a serving as a mask, etching is performed on the Au film 14 and the NiCr film 12 by a dry etching technique, for example. In this manner, a mask layer 18 consisting of the NiCr film 12, the Au film 14, and the Ni film 16a, which are stacked in this order when seen from the substrate 10, is formed. As shown in FIG. 2C, with the mask layer 18 serving as a mask, 150-µm dry etching is performed on the substrate 10, for example.

In a case where the substrate 10 as a layer to be subjected to etching is made of SiC or silicon oxide (quartz) and is to be subjected to etching as shown in FIG. 2C, a fluorine gas such as a $SF_6$ gas or a $NF_3$ gas is used. In a case where the layer to be subjected to etching is made of gallium nitride (GaN), sapphire, aluminum gallium nitride (AlGaN), indium gallium nitride (InGaN), or aluminum nitride (AlN), a chlorine gas such as a $Cl_2$ gas, a $BCl_3$ gas, or a $SiCl_4$ gas is used. The etching of the layers to be subjected to etching may be performed with the use of a RIE (reactive ion etching) device, an ICP (inductive coupled plasma) etching device, or an ECR (electron cyclotron resonance) etching device, for example.

The layers to be subjected to etching (the substrate and other layers) containing at least one of silicon carbonate, silicon oxide, sapphire, gallium nitride, aluminum gallium nitride, indium gallium nitride, and aluminum nitride have a small reaction constant with respect to reactive plasma. Therefore, to increase the etching selectivity with the mask layer 18, it is necessary to reduce the reaction constant of the mask layer 18. As the uppermost layer of the mask layer 18 is the Ni film 16a in the first embodiment, the etching selectivity of the substrate 10 that is the layer to be subjected to etching with respect to the mask layer 18 can be made higher. For example, in a case where the substrate 10 is a SiC substrate or a sapphire substrate, the etching selectivity can be in the range of 30 to 100, or approximately 20, respectively.

Table 1 shows the results of peeling tests that were conducted where each substrate was a SiC substrate, and each mask layer was formed with Ti/Ni films, Ti/Au/Ni films, or NiCr/Au/Ni films. In each peeling test, adhesive tape was bonded onto each mask layer, and the number of mask layers that peeled off when the adhesive tape was removed was counted. In this manner, the adhesion between each substrate and each mask layer can be evaluated. As shown in Table 1, where Ti/Ni films and Ti/Au/Ni films were employed, the number of mask layers that peeled off among the 100 samples was 14 and 8 respectively. Where NiCr/Au/Ni films were employed, no mask layers peeled off. As is apparent from this fact, the adhesion between the mask layer 18 and the substrate 10 can be increased by employing the NiCr film 12 as the film of the mask layer 18 in contact with the substrate 10.

TABLE 1

|  | Ti/Ni | Ti/Au/Ni | NiCr/Au/Ni |
|---|---|---|---|
| Number of samples tested | 100 | 100 | 100 |
| Number of samples having peeled film | 14 | 8 | 0 |

Further, a GaN substrate was used as each substrate, and the NiCr film of the NiCr/Au/Ni films of each mask layer was replaced with a Ni film or a Cr film. The adhesion was then evaluated. The evaluation results showed that the adhesion with a NiCr film was higher than with a Ni film, and the adhesion with a Cr film was higher than with a NiCr film. Accordingly, it is preferable to have a Cr film in contact with the substrate, in terms of adhesion. However, a Cr film causes a problem in the liquid waste disposal after etching is performed. In view of this, the film in contact with the substrate should preferably be a NiCr film. When plasma etching was performed, with a NiCr film serving as a mask layer, it became apparent that a NiCr film does not have high resistance to plasma etching. Therefore, the uppermost layer to be subjected to plasma should be a Ni film that excels in resistance to plasma etching. Further, in a case where a via hole is formed through the substrate, with NiCr/Ni films serving as a mask layer, the NiCr film and the Ni film are detached from each other at a high temperature or after a long-time etching operation. Therefore, an Au film should be provided between the NiCr film and the Ni film. In this manner, the adhesion between the NiCr film and the Ni film is increased, and detachment of the NiCr film and the Ni film from each other can be prevented.

Plasma etching is normally performed at a temperature of 100° C. or lower. Particularly, to increase the speed at which etching is performed on a layer containing at least one of silicon carbonate, silicon oxide, sapphire, gallium nitride, aluminum gallium nitride, indium gallium nitride, and aluminum nitride, etching should preferably be performed at a temperature of 250° C. or higher. If etching is performed at such a high temperature, the NiCr film and the Ni film are detached from each other. Therefore, when etching is performed at a high temperature, a mask layer consisting of NiCr/Au/Ni films is particularly effective.

Figure 3:
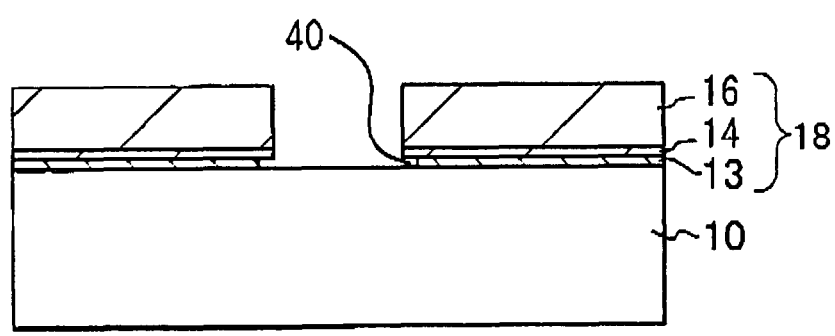
FIG. 3 illustrates the problem with a manufacturing method of a comparative example.

FIG. 3 is a cross-sectional view of a structure that has the mask layer 18 consisting of a Ti film 13, the Au film 14, and a Ni film 16 formed in the same manner as in the first embodiment. In the procedure equivalent to the procedure shown in FIG. 2B, side etching is caused in the Ti film 13, when etching is performed on the Ti film 13, with the Ni film 16 serving as a mask. Side etching is easily caused in the Ti film 13 at the time of dry etching. If side etching is caused in the Ti film 13 as shown in FIG. 3, side etching is also caused in the substrate 10 when etching is performed on the substrate 10. Furthermore, the mask layer 18 is easily detached in this structure. In the first embodiment, the film of the mask layer 18 in contact with the substrate 10 is the NiCr film 12. With this arrangement, the side etching 40 shown in FIG. 3 can be prevented.

Second Embodiment

Figure 4A:
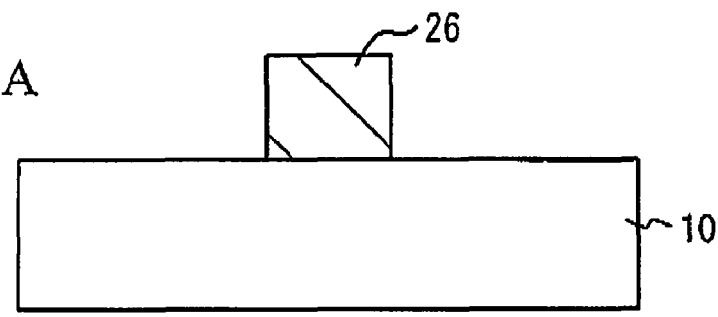
FIGS. 4A through 4D are cross-sectional views showing a method of manufacturing a semiconductor device in accordance with a second embodiment of the present invention.
Figure 4B:
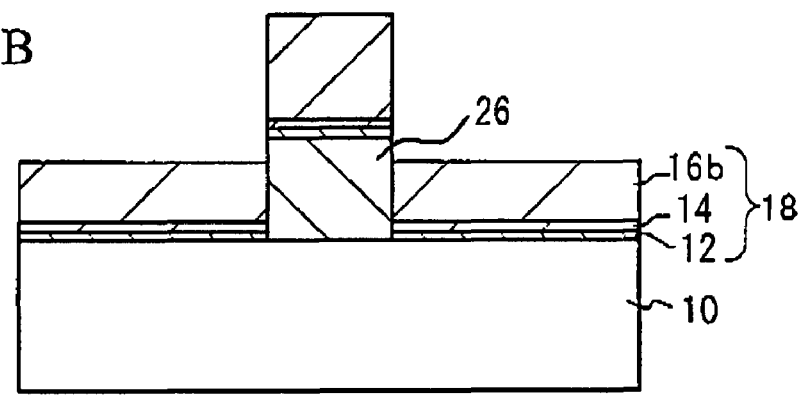
Figure 4C:
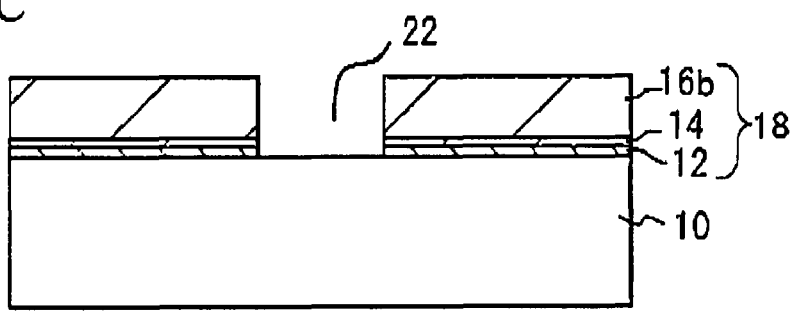
Figure 4D:
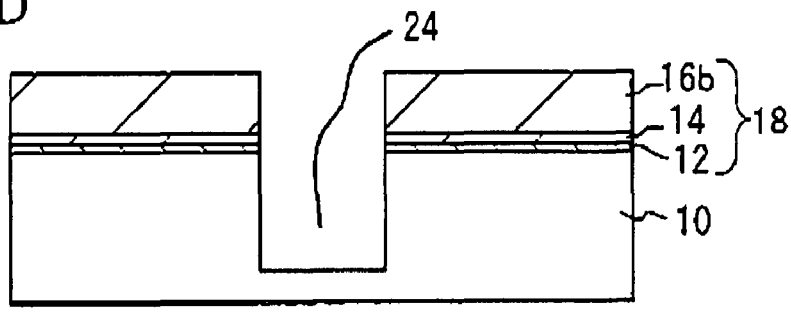

A second embodiment of the present invention is a structure that has a Ni film formed by a vapor deposition technique. FIGS. 4A through 4D are cross-sectional views showing a method of manufacturing a semiconductor device in accordance with the second embodiment. As shown in FIG. 4A, a photoresist pattern 26 is formed on the substrate 10. As shown in FIG. 4B, the NiCr film 12, the Au film 14, and a Ni film 16b are formed on the substrate 10 and the photoresist 26 by a vapor deposition technique, for example. The NiCr film 12, the Au film 14, and the Ni film 16b are formed in this order when seen from the substrate 10. The film thicknesses of those films may be the same as those in the first embodiment, for example. As shown in FIG. 4C, the photoresist 26 is removed, and the film of the photoresist 26 is lifted off. As a result, the mask layer 18 having the opening 22 is formed. As shown in FIG. 4D, with the mask layer 18 serving as a mask, etching is performed on the substrate 10. The etching of the substrate 10 may be performed by any of the techniques described in the first embodiment. In this manner, the mask layer 18 is formed by a vapor deposition technique and a lift-off technique in the second embodiment.

Third Embodiment

Figure 5:
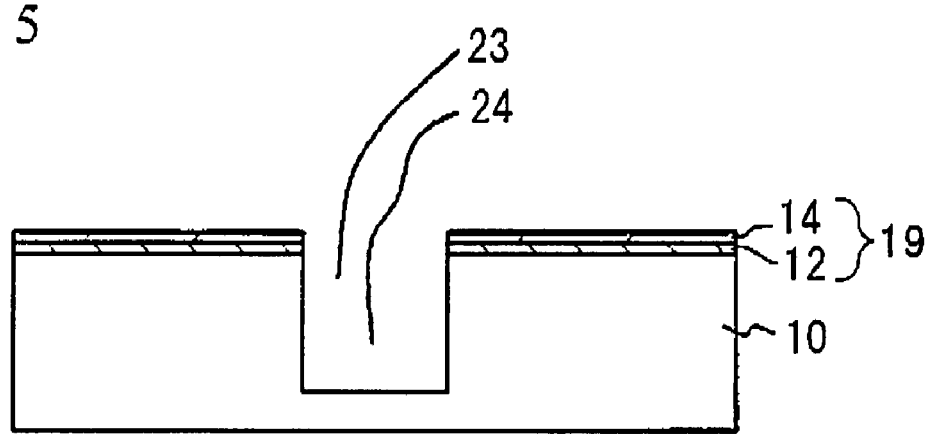
FIG. 5 is a cross-sectional view showing a method of manufacturing a semiconductor device in accordance with a third embodiment of the present invention.

A third embodiment of the present invention is an example structure in which a part of the mask layer 18 is used as an electrode. As shown in FIG. 5, after the procedure equivalent to the procedure of the first embodiment shown in FIG. 2C, or after the procedure equivalent to the procedure of the second embodiment shown in FIG. 4D, the Ni film 16a or 16b is removed from the mask layer 18, and a first metal layer 19 consisting of the NiCr film 12 and the Au film 14 is formed. In a semiconductor device in accordance with the third embodiment, the first metal layer 19 that has an opening 23 and consists of the NiCr film 12 and the Au film 14 in this order when seen from the substrate 10 is formed on the substrate 10. The substrate 10 has a concave portion 24 below the opening 23. The side faces of the concave portion 24 are substantially in conformity with the side faces of the first metal layer 19 (the side faces of the opening 23). As described above, at least a part of the mask layer 18 may be turned into the first metal layer 19, and be used as an electrode, for example. In this manner, it is not necessary to form the first metal layer 19, and the production costs can be reduced. When etching is performed on the substrate 10, a hole that penetrates the substrate 10 may be formed. Alternatively, the Ni film 16a or 16b may not be removed, and the mask layer 18 may be used as an electrode. In such a case, the first metal layer 19 has the Ni film 16a or 16b formed on the Au film 14, as shown in FIG. 2C or FIG. 4D.

Fourth Embodiment

Figure 6A:
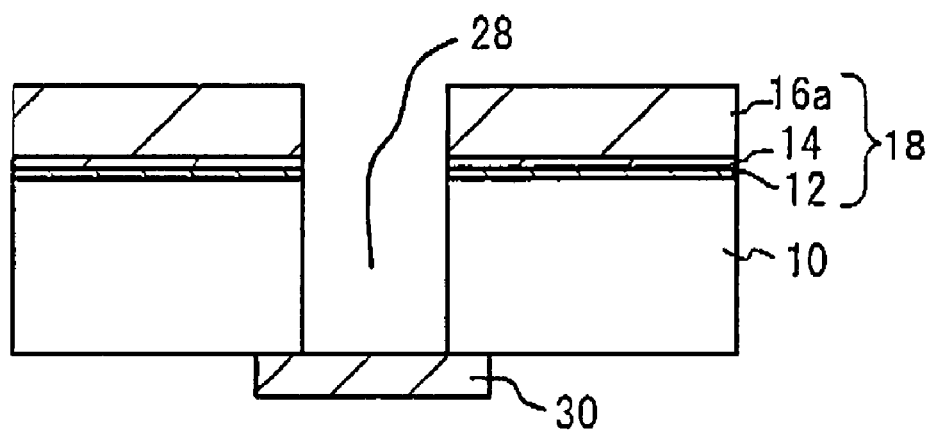
FIGS. 6A and 6B are cross-sectional views showing a method of manufacturing a semiconductor device in accordance with a fourth embodiment of the present invention.
Figure 6B:
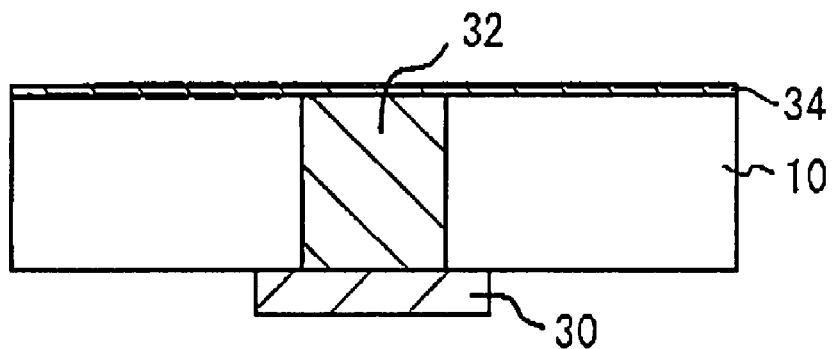

A fourth embodiment of the present invention is an example structure in which the present invention is applied to the etching mask when a via hole 28 that penetrates the substrate 10 as a layer to be subjected to etching is formed. A pad electrode 30 is formed on the top surface of the substrate 10. The bottom surface that is the opposite face from the top surface having a device such as a transistor formed thereon is polished, so that the substrate 10 has a thickness of 150 μm, for example. As in the procedures of the first embodiment shown in FIGS. 1A through 2B and the procedures of the second embodiment shown in FIGS. 4A through 4C, the mask layer 18 is formed on the bottom surface of the substrate 10. As shown in FIG. 6A, with the mask layer 18 serving as a mask, etching is performed on the substrate 10. As a result, the via hole 28 that penetrates the substrate 10 is formed. As shown in FIG. 6B, the mask layer 18 is removed. A second metal layer 32 made of Au, for example, is formed in the via hole 28 by a plating technique or the like. The second metal layer 32 may be made of other metal than Au. A bottom-face electrode 34 is then formed on the bottom surface of the substrate 10. In this manner, the via hole 28 filled with the second metal layer 32 is completed.

Figure 7A:
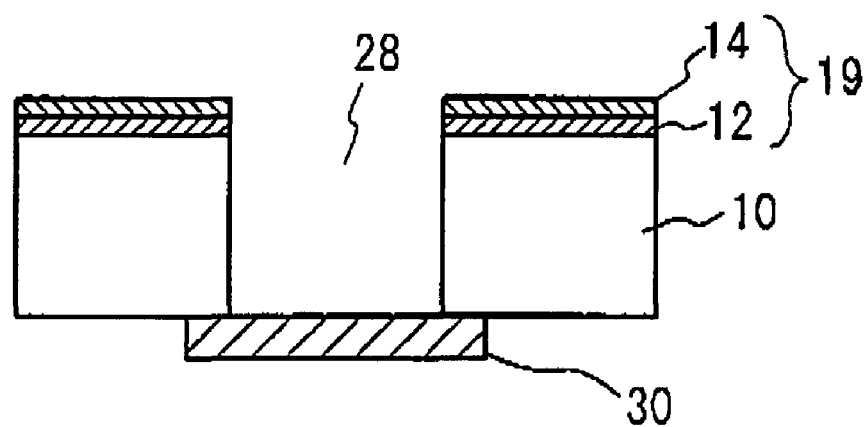
FIGS. 7A and 7B are cross-sectional views showing a method of manufacturing a semiconductor device in accordance with a modification of the fourth embodiment.
Figure 7B:
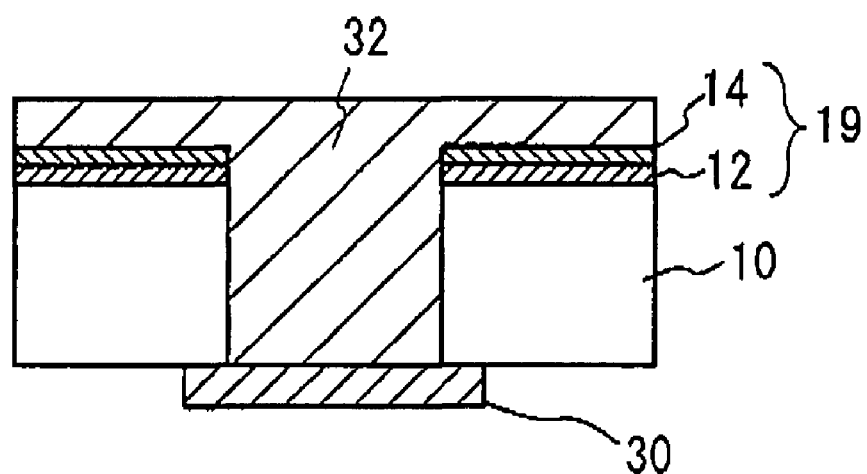

A modification of the fourth embodiment is now described. As shown in FIG. 7A, the Ni film 16 of the mask layer 18 is removed, and the first metal layer 19 consisting of the NiCr/Au films of the mask layer 18 remains, as in the third embodiment. As shown in FIG. 7B, the second metal layer 32 is formed on the first metal layer 19 and in the via hole 28 by a plating technique. In this manner, the second metal layer 32 may be formed in the via hole 28. In the modification of the fourth embodiment, the Au film 14 may be used as a seed metal for forming the second metal layer 32 by a plating technique. The Ni film 16 may not be removed, and may be used as a first metal layer. In such a case, the first metal layer includes the Ni film 16 on the Au film 14. In the fourth embodiment and its modification, the example case in which the second metal layer 32 is formed in the via hole 28 as a hole penetrating the substrate 10 has already been described. However, this feature can also be employed in a structure having the second metal layer 32 formed in a concave portion in the substrate or a layer, as in the second or third embodiment.

Since the thickness of the substrate 10 is more than 10 μm, it is necessary to etch more than 10 μm of the substrate 10 when the via hole 28 is formed. Therefore, the mask layer 18 is required so as to increase the etching selectivity. In accordance with the present invention, the etching selectivity of the substrate 10 and the mask layer 18 can be made higher. Meanwhile, etching needs to be performed at a temperature as high as 250° C. or more, or over a long period of time. As a result, the mask layer 18 is easily detached due to thermal stress. However, in accordance with the present invention, detachment of the mask layer 18 can be prevented.

In the first through third embodiments, the layer to be subjected to etching may be a layer formed on the substrate. In other words, with the mask layer 18 serving as a mask, dry etching may be performed on a layer formed on the substrate 10 in the procedure shown in FIG. 2C or FIG. 4D.

Although a few preferred embodiments of the present invention have been shown and described, it would be appreciated by those skilled in the art that changes may be made in these embodiments without departing from the principles and spirit of the invention, the scope of which is defined in the claims and their equivalents.

Finally, various aspects of the present invention are summarized in the following.

According to an aspect of the present invention, there is provided a method of manufacturing a semiconductor device including: forming a mask layer on a layer that is to be subjected to etching and contains at least one of silicon carbonate, silicon oxide, sapphire, gallium nitride, aluminum gallium nitride, indium gallium nitride, and aluminum nitride, the mask layer having an opening and including a nickel chrome film, a gold film, and a nickel film stacked in this order when seen from the layer to be subjected to etching; and performing etching on the layer to be subjected to etching, with the mask layer serving as a mask.

The above-described method may further include removing the nickel film and forming a first metal layer that includes the gold film.

In the above-described method, the layer to be subjected to etching may be a substrate; and performing etching may include forming a via hole that penetrates the substrate. With this structure, the etching selectivity is high, and detachment of the mask layer can be prevented while the etching for forming the via hole is performed at a high temperature over a long period of time.

In the above-described method, the etching may be performed by one of a reactive ion etching technique, an electron cyclotron resonance etching technique, and an induced coupling plasma etching technique.

In the above-described method, the etching may be performed at a temperature of 250° C. or higher.

The method may further include forming a second metal layer on at least a layer of the mask layer and in a concave or hole portion that is formed by the etching.

According to another aspect of the present invention, there is provided a semiconductor device including: a substrate or layer that contains at least one of silicon carbonate, silicon oxide, sapphire, gallium nitride, aluminum gallium nitride, indium gallium nitride, and aluminum nitride; and a first metal layer that is formed on the substrate or layer, has an opening, and includes a nickel chrome film and a gold film stacked in this order when seen from the substrate or layer, the substrate or layer having a concave or hole portion below the opening.

According to yet another aspect of the present invention, there is provided a semiconductor device including: a substrate or layer that contains at least one of silicon carbonate, silicon oxide, sapphire, gallium nitride, aluminum gallium nitride, indium gallium nitride, and aluminum nitride; and a first metal layer that is formed on the substrate or layer, has an opening, and includes a nickel chrome film and a gold film stacked in this order when seen from the substrate or layer, the substrate or layer having a concave or hole portion below the opening, a second metal layer being formed on the first metal layer and in the concave or hole portion.

In the above-described semiconductor device, the concave or hole portion may be formed by one of a reactive ion etching technique, an electron cyclotron resonance etching technique, and an induced coupling plasma etching technique.

In the above-described semiconductor device, the hole portion may be a via hole that penetrates the substrate. With this structure, the etching selectivity is high, and detachment of the mask layer can be prevented while the etching for forming the via hole is performed at a high temperature over a long period of time.

In the above-described semiconductor device, the first metal layer may include a nickel film formed on the gold film.

In the above-described semiconductor device, the second metal layer may be made of gold. As described above, the present invention provides a semiconductor device that has high etching selectivity and can prevent detachment of the mask layer, and a method of manufacturing such a semiconductor device.

Although a few specific exemplary embodiments employed in the present invention have been shown and described, it would be appreciated by those skilled in the art that changes may be made in these exemplary embodiments without departing from the principles and spirit of the invention, the scope of which is defined in the claims and their equivalents.

The present invention is based on Japanese Patent Application No. 2006-055567 filed on Mar. 1, 2006, the entire disclosure of which is hereby incorporated by reference.

What is claimed is:

1. A method of manufacturing a semiconductor device, comprising:
   forming a mask layer on an underlying layer that is to be subjected to etching and contains at least one of silicon carbonate, silicon oxide, sapphire, gallium nitride, aluminum gallium nitride, indium gallium nitride, and aluminum nitride, the mask layer having an opening and including a nickel chrome film formed directly on the underlying layer that is to be subjected to etching, a gold film formed directly on the nickel chrome film, and a nickel film formed directly on the gold film; and
   etching the underlying layer that is to be subjected to etching by using the mask layer as an etching mask, an upper surface of the nickel film being exposed to a plasma during etching the underlying layer that is to be subjected to etching.

2. The method as claimed in claim 1, further comprising removing the nickel film from the mask layer and forming a first metal layer that includes gold on an underlying layer of the nickel film.

3. The method as claimed in claim 1, wherein:
   the underlying layer that is to be subjected to etching is a substrate; and
   performing etching includes forming a via hole that penetrates the substrate.

4. The method as claimed in claim 1, wherein the etching is performed by one of a reactive ion etching technique, an electron cyclotron resonance etching technique, and an induced coupling plasma etching technique.

5. The method as claimed in claim 1, wherein the etching is performed at a temperature of 250° C. or higher.

6. The method as claimed in claim 1, further comprising forming a second metal layer on at least a layer of the mask layer and in a concave or via hole portion that is formed by the etching.

* * * * *